(12) United States Patent
Cheong (10) Patent No.: US 7,989,826 B2
(45) Date of Patent: Aug. 2, 2011

(54) SEMICONDUCTOR LIGHT EMITTING DEVICE

(75) Inventor: Hung Seob Cheong, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 233 days.

(21) Appl. No.: 12/388,986

(22) Filed: Feb. 19, 2009

(65) Prior Publication Data

US 2009/0206351 A1    Aug. 20, 2009

(30) Foreign Application Priority Data

Feb. 20, 2008    (KR) .................. 10-2008-0015174

(51) Int. Cl.
*H01L 33/00*    (2010.01)
*H01L 21/00*    (2006.01)

(52) U.S. Cl. ............... 257/95; 257/622; 438/29; 438/42

(58) Field of Classification Search .................. None
See application file for complete search history.

(56) References Cited

U.S. PATENT DOCUMENTS

| | | | | |
|---|---|---|---|---|
| 6,320,209 B1 * | 11/2001 | Hata et al. | ..... | 257/190 |
| 7,652,295 B2 * | 1/2010 | Cho et al. | ..... | 257/79 |
| 7,663,151 B2 * | 2/2010 | Ikeda et al. | ..... | 257/95 |
| 2003/0218179 A1 * | 11/2003 | Koide et al. | ..... | 257/95 |
| 2005/0145864 A1 * | 7/2005 | Sugiyama et al. | ..... | 257/95 |
| 2007/0221907 A1 * | 9/2007 | Jang et al. | ..... | 257/13 |

* cited by examiner

*Primary Examiner* — Alonzo Chambliss (74) *Attorney, Agent, or Firm* — Birch, Stewart, Kolasch & Birch, LLP (57) ABSTRACT

Embodiments provide a semiconductor light emitting device which comprises a first conductive semiconductor layer, an active layer on the first conductive semiconductor layer, a second conductive semiconductor layer on the active layer, and a plurality of third semiconductor structures spaced apart on the second conductive semiconductor layer.

20 Claims, 8 Drawing Sheets

SEMICONDUCTOR LIGHT EMITTING DEVICE

CROSS-REFERENCE TO RELATED APPLICATIONS

The present application claims priority under 35 U.S.C. 126 to Korean Patent Application No. 10-2008-0015174 (filed on Feb. 20, 2008), which is hereby incorporated by reference in its entirety.

BACKGROUND

The present disclosure relates to a semiconductor light emitting device.

Group III-V nitride semiconductors have been variously applied to an optical device such as blue and green Light Emitting Diodes (LED), a high speed switching device such as a Metal Oxide Semiconductor Field Effect Transistor (MOSFET), a High Electron Mobility Transistor (HEMT) and a Hetero junction Field Effect Transistor (HFET), and a light source of a lighting device or a display device.

The nitride semiconductor is mainly used for the LED or a Laser Diode (LD), and studies have been continuously conducted to improve the manufacturing process or light efficiency of the nitride semiconductor.

SUMMARY

Embodiments provide a semiconductor light emitting device comprising a third semiconductor structure that is formed in a plurality of horn shapes on a light emitting structure.

Embodiments provide a semiconductor light emitting device comprising a horn-shaped third semiconductor structure having an acute-angle point on a light emitting structure.

Embodiments provide a semiconductor light emitting device, which can improve light extraction efficiency by a horn-shaped third semiconductor structure.

Embodiments provide a semiconductor light emitting device comprising a sub light emitting structure of a horn shape and a first electrode in a mesa etching region.

An embodiment provides a semiconductor light emitting device comprising: a first conductive semiconductor layer; an active layer on the first conductive semiconductor layer; a second conductive semiconductor layer on the active layer; and a plurality of third semiconductor structures spaced apart on the second conductive semiconductor layer.

An embodiment provides a semiconductor light emitting device comprising: a first conductive semiconductor layer; an active layer on the first conductive semiconductor layer; a second conductive semiconductor layer on the active layer; and a plurality of horn-shaped third semiconductor structures having a point of an acute angle on the second conductive semiconductor layer.

An embodiment provides a semiconductor light emitting device comprising: a first conductive semiconductor layer; an active layer on the first conductive semiconductor layer; a second conductive semiconductor layer on the active layer; a plurality of horn-shaped third semiconductor structures spaced apart on the second conductive semiconductor layer; a horn-shaped electrode layer on the third semiconductor structure.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, each element will be described as an example and is not limited to the size of the accompanying drawings.

Figure 1:
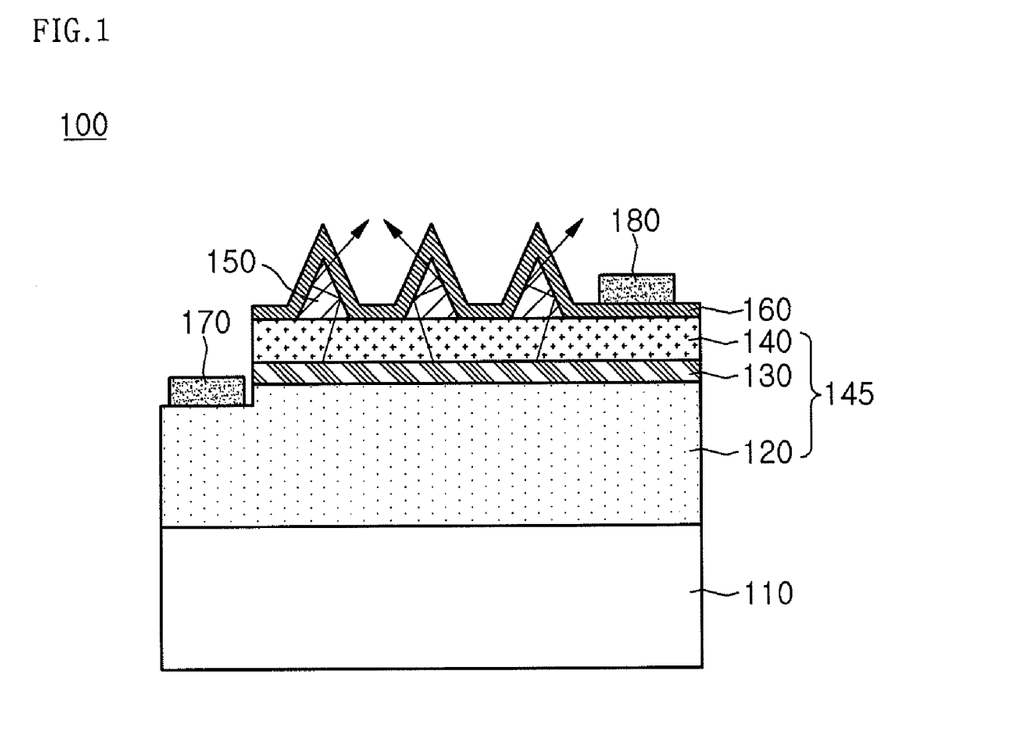
FIG. 1 is a side-sectional view of a semiconductor light emitting device according to one embodiment.

FIG. 1 is a side-sectional view of a semiconductor light emitting device according to a first embodiment.

Referring to FIG. 1, a semiconductor light emitting device 100 according to the first embodiment comprises a substrate 110, a first conductive semiconductor layer 120, an active layer 130, a second conductive semiconductor layer 140, a horn-shaped third semiconductor structure 150, a transparent electrode layer 160, a first electrode 170, and a second electrode 180.

The substrate 110 may be selected from the group consisting of sapphire substrate ($Al_2O_3$), GaN, SiC, ZnO, Si, GaP and GaAs, but is not limited to this embodiment.

A buffer layer (not shown) or/and an undoped semiconductor layer (not shown) may be formed on the substrate 110. The buffer layer is a layer for decreasing a lattice constant difference with the substrate 110, and may be formed of a group III-V compound semiconductor, for example, GaN, AlN, AlGaN, InGaN, InN, InAlGaN, and AlInN.

Moreover, the undoped semiconductor layer may be formed of a GaN type. At least one of the buffer layer and the undoped semiconductor layer is formed on the substrate 110, or both the buffer layer and the undoped semiconductor layer may not be formed on the substrate 110.

At least one first conductive semiconductor layer 120 is formed on the substrate 110. The first conductive semiconductor layer 120 may be formed of at least one of the compound semiconductors of group III-V elements (on which a first conductive dopant is doped), for example, GaN, AlN, AlGaN, InGaN, InN, InAlGaN and AlInN. In a case where the first conductive semiconductor 120 is an N-type semiconductor layer, the first conductive dopant comprises an N-type dopant such as Si, Ge, Sn, Se and Te. The first conductive semiconductor layer 120 may serve as an electrode contact layer, but is not limited to this embodiment.

The active layer 130 is formed on the first conductive semiconductor layer 120, and the active layer 130 may be formed in single quantum well structure or multiple quantum well structure.

The active layer 130 may be formed according to the period of a well layer and a barrier layer, for example, the period of an InGaN well layer/GaN barrier layer or the period of an AlGaN well layer/GaN barrier layer by using the compound semiconductor material of group III and group V elements.

The active layer 130 may be formed of a material having a bandgap energy according to the wavelength of an emitting light. The active layer 130 may comprise a material emitting a chromatic light such as a light having a blue wavelength, a light having a red wavelength and a light having a green wavelength.

A conductive clad layer may be formed on and/or under the active layer 130, and the conductive clad layer may be formed of an AlGaN layer.

At least one second conductive semiconductor layer 140 is formed on the active layer 130, and the second conductive semiconductor layer 140 may be formed of at least one of the compound semiconductors of group III-V elements (on which a second conductive dopant is doped), for example, GaN, AlN, AlGaN, InGaN, InN, InAlGaN and AlInN. In a case where the second conductive semiconductor layer 140 is a P-type semiconductor layer, the second conductive dopant may comprise a P-type dopant such as Mg and Ze. The second conductive semiconductor layer 140 may serve as an electrode contact layer, but is not limited to this embodiment.

Herein, the first conductive semiconductor layer 120, the active layer 130 and the second conductive semiconductor layer 140 may be defined as a light emitting structure 145. The first conductive semiconductor layer 120 may be formed of a P-type semiconductor layer, and the second conductive semiconductor layer 140 may be formed of an N-type semiconductor layer. Moreover, the third conductive semiconductor layer, for example, an N-type semiconductor layer or a P-type semiconductor layer, may be formed on the second conductive semiconductor layer 140. Accordingly, the light emitting structure 145 may comprise at least one of an N-P junction structure, a P-N junction structure, an N-P-N junction structure and a P-N-P structure.

The third semiconductor structure 150 is formed on the second conductive semiconductor layer 140 or the third conductive semiconductor layer. The third semiconductor structure 150 may be formed in a portion or entire region of the top of the second conductive semiconductor layer 140. A plurality of the horn-shaped third semiconductor structures 150 may be formed spaced apart. The third semiconductor structure 150 may be formed of at least one of group III-V compound semiconductors, for example, GaN, AlGaN, InGaN, InN, AlN and InAlGaN.

Moreover, the third semiconductor structure 150 may be formed of a conductive semiconductor layer, on which the first conductive dopant or the second conductive dopant is doped, or an undoped semiconductor layer.

The third semiconductor structure 150 may be formed in a multi-angle horn shape or a multi-angle truncated-horn shape. Moreover, the crystal surface or shape of the third semiconductor structure 150 may be partially changed according to a semiconductor material or an etching degree.

The transparent electrode layer 160 may be formed on the third semiconductor structure 150 and the second conductive semiconductor layer 140. The transparent electrode layer 160 may be formed of at least one of ITO, ZnO, RuOx, TiOx and IrOx.

Figure 2:
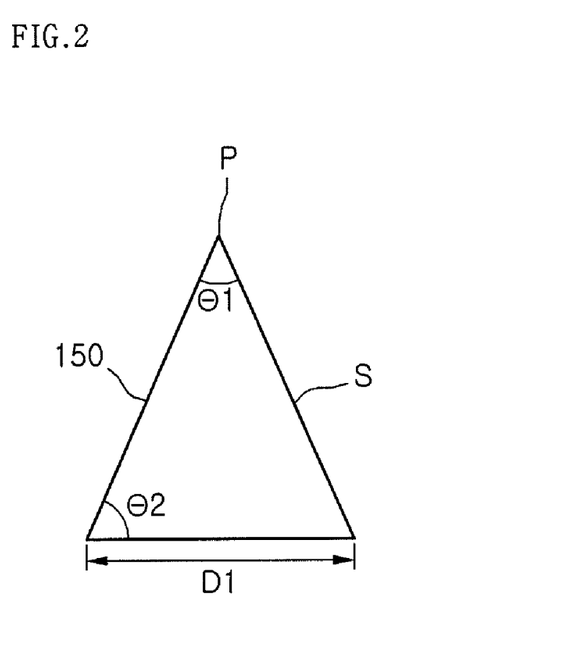
FIG. 2 is an exemplary diagram of the third semiconductor structure of FIG. 1.

FIG. 2 is an exemplary diagram of the third semiconductor structure of FIG. 1.

Referring to FIGS. 1 and 2, the internal angle ($\theta 1$) of the point P of the third semiconductor structure 150 may be formed at an acute angle ($0°<\theta 1<90°$), and the angle ($\theta 2$) between the bottom and slope S of the third semiconductor structure 150 may be formed at about 10° to 80° or 30° to 70°.

Since there is almost no medium difference between the horn-shaped third semiconductor structure 150 and the second conductive semiconductor layer 140, most of light incident to the surface of the second conductive semiconductor layer 140 is incident to the third semiconductor structure 150.

Light incident to the third semiconductor structure 150 is transmitted, or is reflected one or more times. Accordingly, the third semiconductor structure 150 changes the critical angle of incident light, thereby emitting most of the incident light to the outside.

The third semiconductor structure 150 can emit most of light, which is incident through the second conductive semiconductor layer 140, to the outside by the internal angle ($\theta 1$) of the point P and the slope S. Accordingly, the third semiconductor structure 150 improves light extraction efficiency, thereby improving external quantum efficiency.

Since the horn-shaped third semiconductor structure 150 has a horizontal surface facing with the second conductive semiconductor layer 140, it can improve light extraction efficiency.

Table 1 below lists emission angles at which the internal total reflection of light emitted from the each interface of a material constituting a GaN-type LED device is not reached and a portion of the emitted light can be extracted to the outside.

TABLE 1

| Interface | GaN/air | GaN/epoxy | GaN/ITO |
|---|---|---|---|
| Emission angle | 24° | 37° | 57° |

The third semiconductor structure 150 is formed in a structure where the internal angle ($\theta 1$) of the horn-shaped point P and the slope S correspond to the emission angle, and thus can emit most of light, being incident through the second conductive semiconductor layer 140, to the outside.

Referring again to FIG. 1, a first electrode 170 is formed on the first conductive semiconductor layer 120, and a second electrode 180 is formed on the transparent electrode layer 160. Herein, the second electrode 180 may be formed on the transparent electrode layer 160 or the second conductive semiconductor layer 140. That is, the second electrode 180 is formed in a direct contact form or an indirect contact form on the transparent electrode layer 160 and the second conductive semiconductor layer 140.

If light emitted from the active layer 130 is incident through the second conductive semiconductor layer 140, the third semiconductor structure 150 can decrease the reflection rate of light reflected to the second conductive semiconductor layer 140. Moreover, incident light is reflected along the horn-shaped slope of the third semiconductor structure 150 one or more times (for example, a zigzag type), thereby being emitted to the outside. Accordingly, the third semiconductor structure 150 can improve the light extraction efficiency of the LED.

Moreover, the second conductive semiconductor layer 140 may be formed to have thickness thinner than that of the existing LED Epi structure. Accordingly, most current flows to the second conductive semiconductor layer 140, thereby improving forward voltage drop (Vf) upon driving of the LED.

FIGS. 3 to 11 are exemplary diagrams illustrating a process for manufacturing a semiconductor light emitting device according to the first embodiment.

Figure 3:
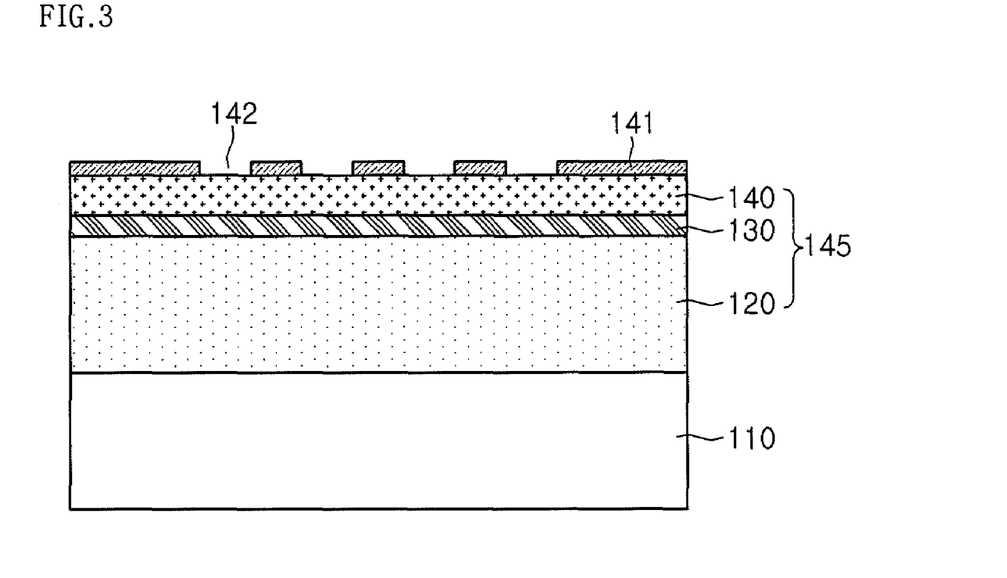
FIGS. 3 to 11 are exemplary diagrams illustrating a process for manufacturing a semiconductor light emitting device according to a first embodiment.

Referring to FIG. 3, the light emitting structure 145 is formed on the substrate 110.

The substrate 110 may be selected from the group consisting of sapphire substrate ($Al_2O_3$), GaN, SiC, ZnO, Si, GaP and GaAs. A concave-convex pattern or a roughness structure may be formed on the surface of the substrate 110, but the surface structure of the substrate 110 is not limited to this embodiment.

A nitride semiconductor is grown on the substrate 110, and may be grown by a growth equipment such as electron beam evaporator, Physical Vapor Deposition (PVD), Chemical Vapor Deposition (CVD), Plasma Laser Deposition (PLD), dual-type thermal evaporator, sputtering, Metal Organic Chemical Vapor Deposition (MOCVD). However, the grown equipment is not limited to this embodiment.

Other semiconductors, for example, a buffer layer (not shown) or/and an undoped semiconductor layer (not shown) may be formed between the substrate 110 and the light emitting structure 145. The buffer layer may be formed of at least one of GaN, AlN, AlGaN, InGaN, InN, InAlGaN and AlInN, and the undoped semiconductor layer may be formed of a GaN type. However, the buffer layer and the undoped semiconductor layer are limited to these embodiments.

The light emitting structure 145 comprises the first conductive semiconductor layer 120, the active layer 130, and the second conductive semiconductor layer 140.

The first conductive semiconductor layer 120 may be formed of at least one of the compound semiconductors of group III-V elements (on which the first conductive dopant is doped), for example, GaN, AlN, AlGaN, InGaN, InN, InAlGaN and AlInN. In a case where the first conductive semiconductor 120 is an N-type semiconductor layer, the first conductive dopant comprises an N-type dopant such as Si, Ge, Sn, Se and Te.

The active layer 130 is formed on the first conductive semiconductor layer 120, and the active layer 130 may be formed in the single quantum well structure or the multiple quantum well structure. The active layer 130 may comprise a material emitting the chromatic light such as a light having a blue wavelength, a light having a red wavelength and a light having a green wavelength. The conductive clad layer may be formed on and/or under the active layer 130, and the conductive clad layer may be formed of the AlGaN layer.

At least one second conductive semiconductor layer 140 is formed on the active layer 130, and the second conductive semiconductor layer 140 may be formed of at least one of the compound semiconductors of group III-V elements (on which the second conductive dopant is doped), for example, GaN, AlN, AlGaN, InGaN, InN, InAlGaN and AlInN. In a case where the second conductive semiconductor layer 140 is a P-type semiconductor layer, the second conductive dopant may comprise a P-type dopant such as Mg and Ze.

The third conductive semiconductor layer, for example, an N-type semiconductor layer or a P-type semiconductor layer, may be formed on the second conductive semiconductor layer 140. Accordingly, the light emitting structure 145 may comprise at least one of an N-P junction structure, a P-N junction structure, an N-P-N junction structure and a P-N-P structure.

A mask layer 141 is formed on the second conductive semiconductor layer 140. A plurality of holes 142, which are spaced apart from each other, are formed on the mask layer 141. The mask layer 141 may be selected from the group consisting of $SiO_2$, $SiO_x$, $SiN_2$, $SiN_x$, $SiO_xN_y$, and a metal material. The holes 142 may be formed in circle, polygon or the mixed shape of these, but are not limited to this embodiment.

Figure 4:
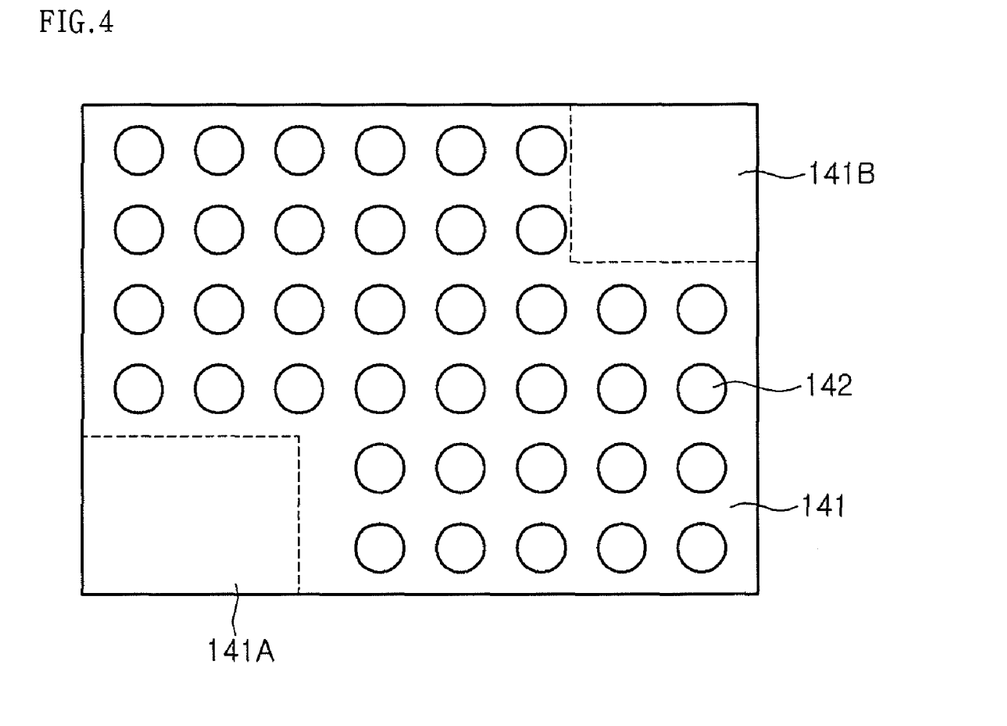

FIG. 4 is a plan view of the mask layer of FIG. 3.

Referring to FIGS. 3 and 4, the holes 142 of the mask layer 142 expose the second conductive semiconductor layer 140, and may be formed at regular intervals or irregular intervals. Moreover, the holes 142 of the mask layer 141 may not be formed in a mesa etching region 141A and an electrode forming region 141B, and the mesa etching region 141A and the electrode forming region 141B may be formed in the corner region of a device or other region. However, the hole 142 of the mask layer 141 is not limited to this embodiment.

The diameters of the holes 142 of the mask layer 141 and the intervals of the holes 142 may be equal to or different from one another. Moreover, the arrangement type of the holes 142 may be formed in a matrix type or a zigzag type, but is not limited to this embodiment. The diameters of the holes 142 of the mask layer 142 may be 1 um to 10 um, and may be varied according to the size of a chip.

Figure 5:
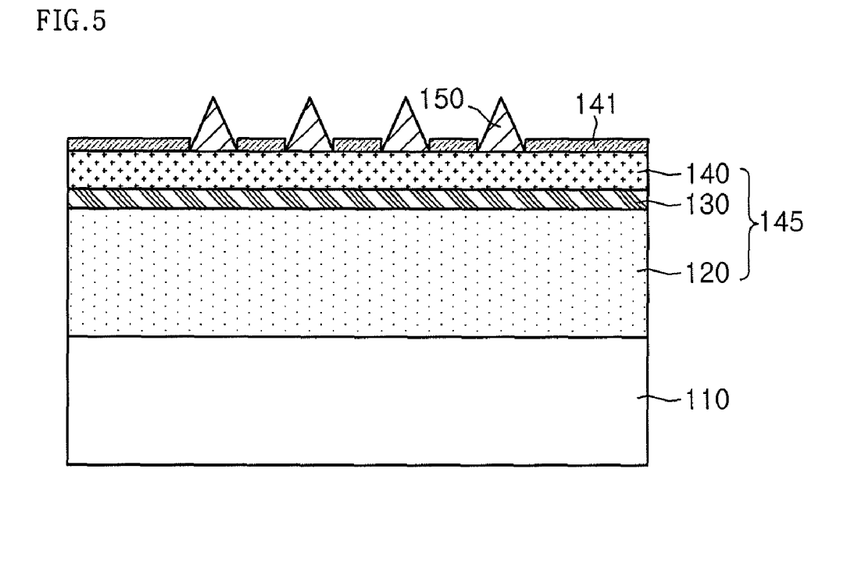

Referring to FIG. 5, the third semiconductor structure 150 is formed in the holes 142 of the mask layer 141. The third semiconductor structure 150 is formed in a horn shape on the second conductive semiconductor layer 140 through the holes 142, and may be formed of at least one of the compound semiconductors of group III-V elements, for example, GaN, AlGaN, InGaN, InN, AlN and AlInN.

The third semiconductor structure 150 may be formed of a P-type semiconductor layer or an N-type semiconductor layer on which a first conductive dopant or a second conductive dopant is doped. Moreover, the third semiconductor structure 150 may be formed of an undoped semiconductor layer on which a conductive dopant is not doped. The material of the third semiconductor structure 150 may be formed in consideration of medium difference or the difference of the index of refraction with the second conductive semiconductor layer 140.

In a case where the third semiconductor structure 150 is a P-type GaN, the third semiconductor structure 150 may be formed in a CVD (or MOCVD). For example, the third semiconductor structure 150 may use a group-III gas such as trimethyl gallium (TMGa) or triethyl gallium (TEGa) in a source gas for Ga, may use a group-V gas such as ammonia ($NH_3$), monomethyl hydrazine (MMHy) or dimethyl hydrazine (DMHy) in a source gas for N, and may use $CP_2Mg$ in a source gas for Mg.

At this point, the third semiconductor structure 150 may be formed in a desired structure shape (for example, a horn shape) according to growth conditions such as a growth temperature, a group-V gas to group-III gas ratio, and a growth pressure. Upon growth of the third semiconductor structure 150, the first embodiment may selectively use a process of decreasing a temperature, a process of increasing a pressure and a process of decreasing a group-V gas to group-III gas ratio (for example, $NH_3$/TMGa) in the growth condition of the second conductive semiconductor layer 140. Moreover, the ratio of a temperature, a pressure and a gas may be controlled by degrees or on certain condition. At this point, $N_2$ or/and $H_2$ may be used as an atmosphere gas.

Specifically, the third semiconductor structure 150, for example, may be grown using the growth temperature of about 700° C. to 1050° C., the growth pressure of about 100 mbar to 600 mbar and the group V gas to group III gas ratio of about 100 to 5000. Such growth conditions may be changed according to the growth equipment, and a vertical growth rate may be changed according to each variable (a temperature, a pressure, and an amount of a gas).

Upon growth of the third semiconductor structure 150, a horizontal growth rate is higher than a vertical growth rate at the initial stage of growth, and thereafter the vertical growth rate (C-axis) is higher than the horizontal growth rate. In such a growth mode, the horizontal surface of the third semiconductor structure 150 is removed by the vertical growth so that the third semiconductor structure 150 can be formed in a convex structure. Upon growth of the third semiconductor structure 150, the initial stage of growth is performed for about 20 minutes, and thereafter growth may be performed in a mode where the vertical growth is accelerated.

Herein, the bottom of the third semiconductor structure 150 may be formed in the same shape as that of the hole 142 of the mask layer 141, and the top of the third semiconductor structure 150 may be grown in a multi-angle horn shape comprising a hexagon pyramid by the crystallinity of a GaN-type semiconductor.

The third semiconductor structure 150 may be formed in a horn shape without using the mask layer 141, but is not limited to this embodiment.

Figure 6:
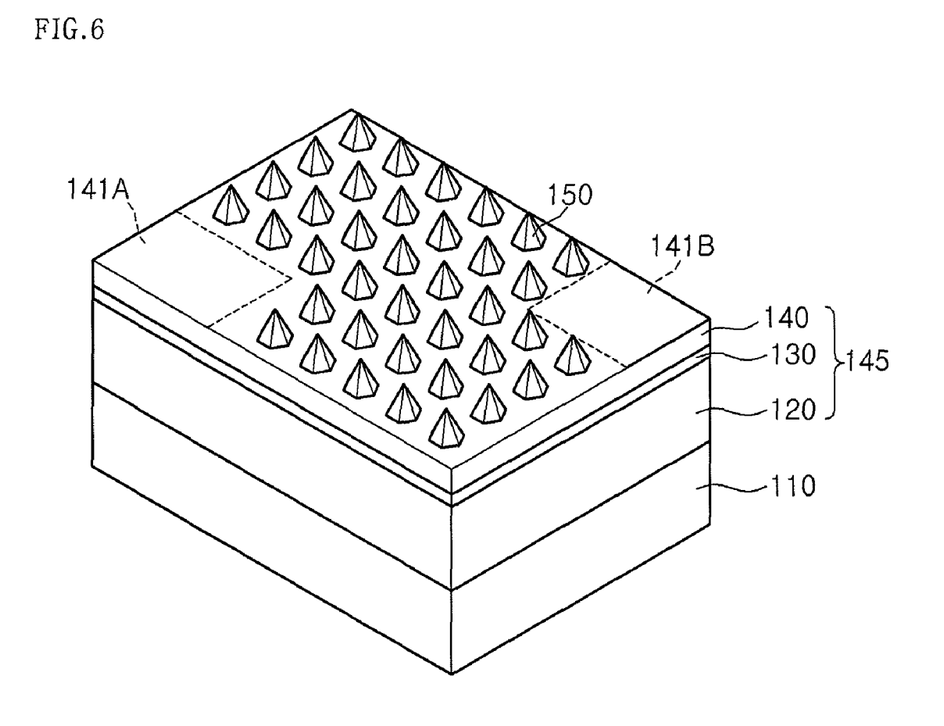

FIG. 6 is a perspective view of the third semiconductor structure of FIG. 5.

Referring to FIGS. 5 and 6, when the mask layer 141 is removed, a plurality of the horn-shaped third semiconductor structures 150 may be arranged spaced apart on the second conductive semiconductor layer 140. The third semiconductor structure 150 may be arranged in a matrix type.

The sizes of the horns of the third semiconductor structure 150 may be equal to or different from one another. This may be changed according to the sizes of the holes 142 of the mask layer 141 illustrated in FIGS. 2 and 3.

Figure 7:
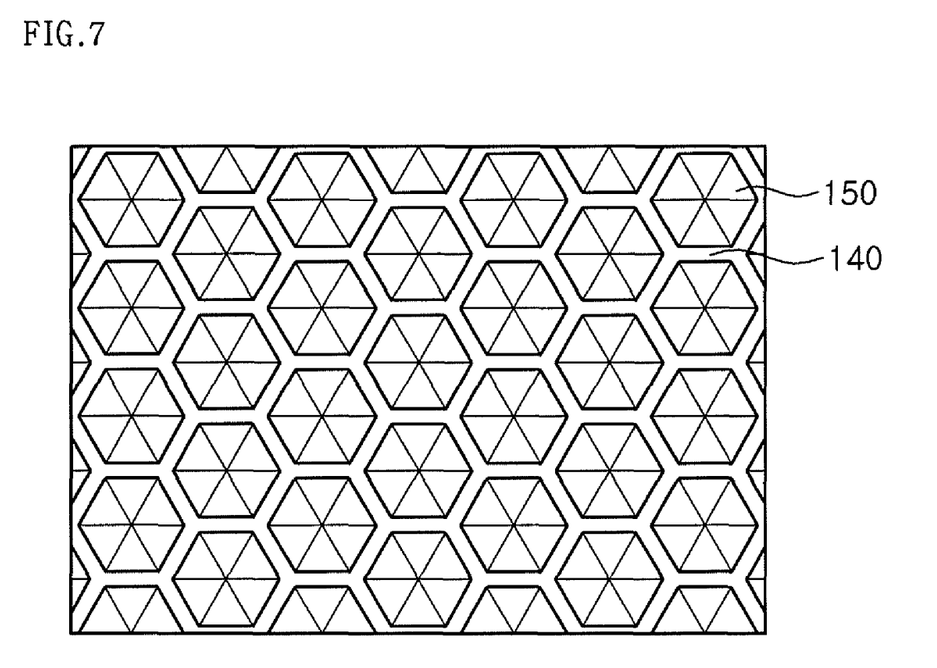

FIG. 7 is a plan view illustrating another arrangement example of the third semiconductor structure of FIG. 5.

Referring to FIG. 7, the third semiconductor structure 150 may be arranged in a zigzag type with respect to an adjacent column. Such an arrangement type may be changed.

Figure 8:
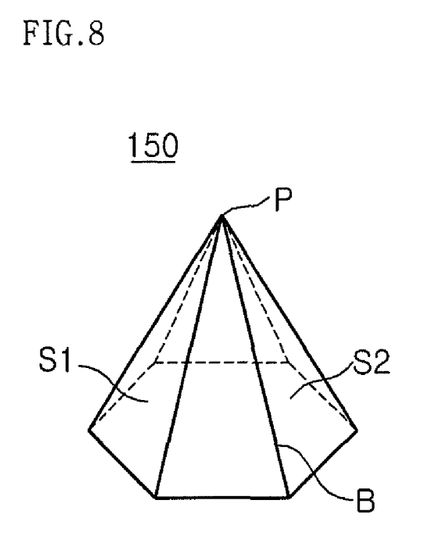
Figure 9:
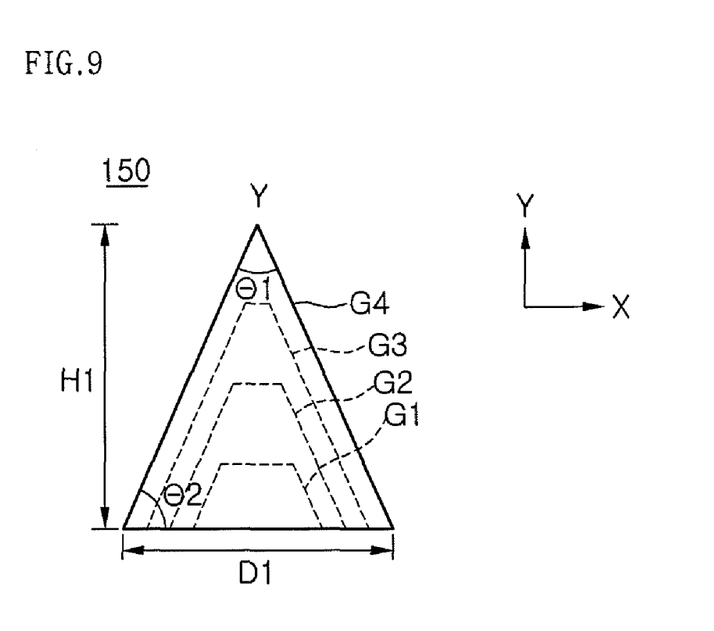

FIG. 8 is a magnification view of the third semiconductor structure of FIG. 5. FIG. 9 is an exemplary diagram illustrating the growth type of the third semiconductor structure of FIG. 5.

Referring to FIGS. 8 and 9, the third semiconductor structure 150 has the crystal surface of a horn shape (for example, a hexagon pyramid shape), and six surfaces may be formed in 1$\bar{1}$01 plane S1 and 11$\bar{2}$2 plane S2. In the horn shape, the slope angle ($\theta 2$) between the bottom and each surface of the third semiconductor structure 150 may be formed at about 30° to 70°, and the internal angle ($\theta 1$) of the point P of the third semiconductor structure 150, that is, an acute angle may be formed at about $0<\theta 1<90°$. Herein, the slope angel ($\theta 2$) of the surface of the horn shape may be changed according to the size of the third semiconductor structure 150.

Moreover, the point P of the third semiconductor structure 150 may be etched in the type of a spherical surface or a cut shape (that is, a multi-angle truncated-horn shape). The surface of the third semiconductor structure 150 and the boundary surface of the surface may be etched in the spherical surface.

Referring to FIG. 9, in the third semiconductor structure 150, the horizontal growth (G1) of the X-axis direction is accelerated at the initial stage of growth, the vertical growths (G2, G3) of the Y-axis (or C-axis) direction are accelerated by degrees later, and the point is formed by the vertical growth (G4) having no horizontal surface at the final stage of growth. The growth condition of the third semiconductor structure 150 is controlled, and thus the third semiconductor structure 150 is formed in a multi-angle horn shape or may not have a complete multi-angle horn shape.

The diameter D1 of the bottom of the third semiconductor structure 150 may be formed to about 1 um to 10 um, and the height H1 of the third semiconductor structure about 150 may be formed to about 1 um to 10 um.

Figure 10:
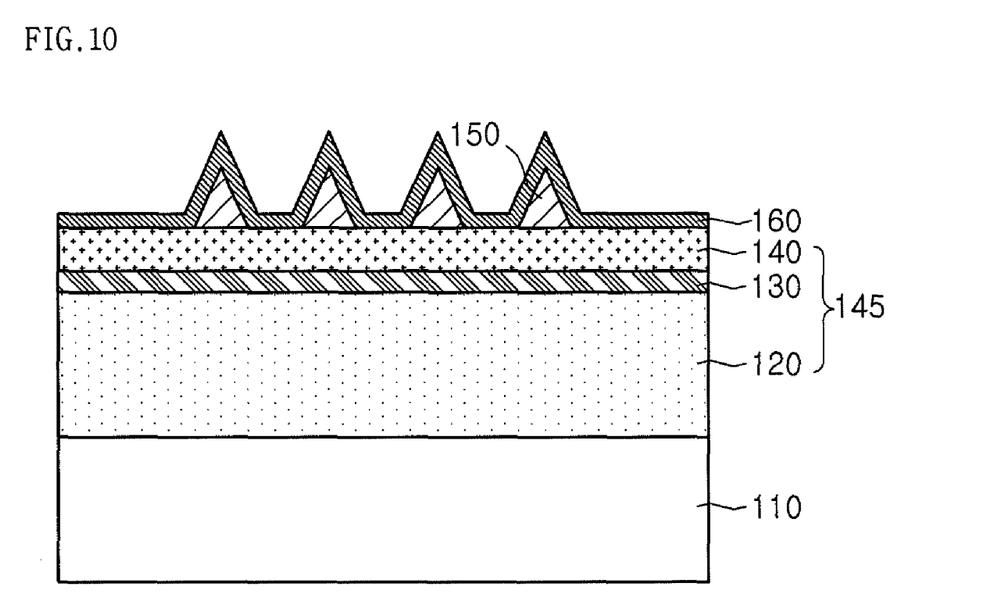

Referring to FIG. 10, the transparent electrode layer 160 may be formed on the second conductive semiconductor layer 140 and the third semiconductor structure 150. The transparent electrode layer 160 may be formed of at least one of ITO, ZnO, RuOx, TiOx and IrOx.

Figure 11:
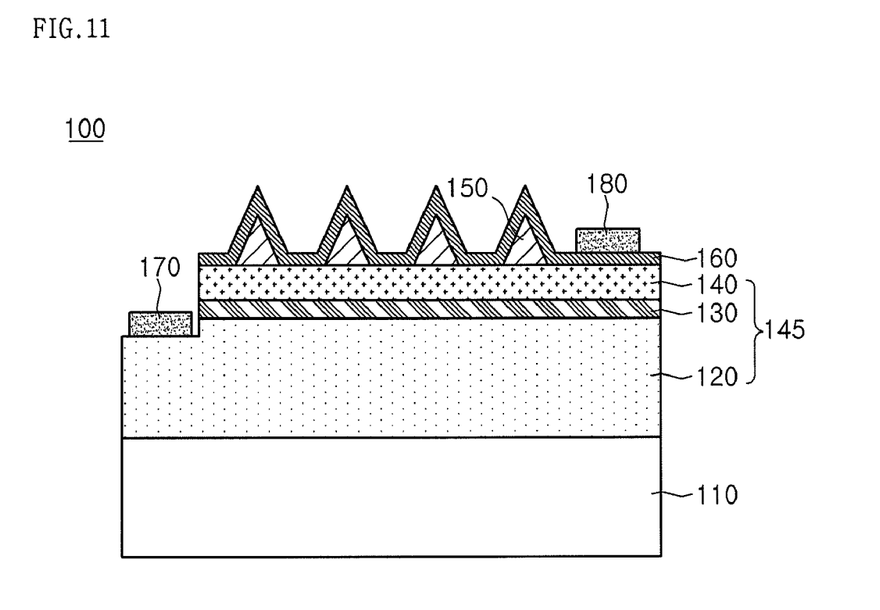

Referring to FIG. 11, when the transparent electrode layer 160 is formed, mesa etching is performed through a mesa etching region to thereby expose a portion of the first conductive semiconductor layer 120. The first electrode 170 is formed on the first conductive semiconductor layer 120, and the second electrode 180 is formed on the transparent electrode layer 160. Herein, the second electrode 180 may be formed on the transparent electrode layer 160 or/and the second conductive semiconductor layer 140.

The critical angle of light, which is incident to the third semiconductor structure 150 through the second conductive semiconductor layer 140, is changed, or is reflected one or more times, thereby being emitted to the outside. That is, most of the incident light can be emitted to the outside.

That is, in a case where the semiconductor light emitting device 100 is mounted in a flip-chip type, a reflection electrode layer instead of a transparent electrode layer may be formed on the second conductive semiconductor layer 140 and the third semiconductor structure 150. Moreover, the transparent electrode layer may not be formed.

Figure 12:
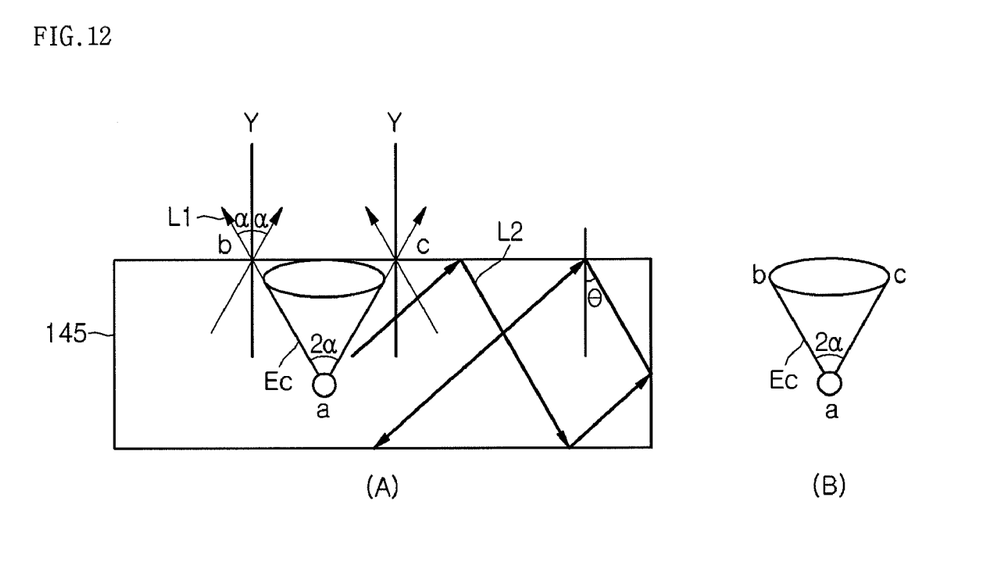
FIG. 12 is an exemplary diagram illustrating an internal total reflection critical angle in the light emitting structure according to the first embodiment.

FIG. 12 is an exemplary diagram illustrating an internal total reflection critical angle in the light emitting structure according to the first embodiment.

Referring to FIGS. 12(A) and 12(B), light generated by the active layer 130 of the light emitting structure 145 is radiated in the front direction. The radiation shape of the light may be represented in the shape of an escape cone (Ec). When the incident light of light radiated from the light source (a) of the escape cone structure to the interface positions (b, c) of the semiconductor layer is equal to or greater than the internal total reflection critical angle ($\alpha$) (that is, $\alpha \leq \theta$), the internal total reflection of light L2 is reached. When the incident angle of the light is less the internal total reflection critical angle ($\alpha$), a portion of light L1 is emitted to the outside and other portion of the light L1 is reflected to the inside.

Herein, the range of the emission angle of the incident light L1 reaches the range of about 20° to 60° in the interface of the semiconductor layer. The emission angle is an angle at which the internal total reflection of light radiated to the interface of the semiconductor layer is not reached and a portion of the radiated light can be extracted to the outside of the semiconductor layer. The interface of the semiconductor layer may be the interface of the second conductive semiconductor layer 140 and the third semiconductor structure 150.

Herein, an emission angle, at which the internal total reflection of light emitted from the each interface of a material constituting the GaN-type LED is not reached and a portion of the emitted light can be extracted to the outside, is as follows.

As illustrated in FIGS. 11 and 12, in a case where the second conductive semiconductor layer 140 and the third semiconductor structure 150 are GaN and the transparent electrode layer 160 is ITO, the light emission angle of a GaN/air interface is about 24°, the light emission angle of a GaN/epoxy interface is about 37°, and the light emission angle of GaN/ITO interface is about 57°. Herein, the epoxy represents the example of grease sealing the LED.

The internal angle ($\theta 1$ of FIG. 9) of the point of the third semiconductor structure 150 is formed at an angle corresponding to the emission angle, and may be greater or less than the internal angle ($2\alpha$) of the point (a) of the escape cone (Ec).

The third semiconductor structure 150 emits most of light, which is incident at the emission angle through the second conductive semiconductor layer 140, to the outside, thereby improving light extraction efficiency. Moreover, the horizontal surface is not formed on the third semiconductor structure 150 so that light extraction efficiency can be improved.

Figure 13:
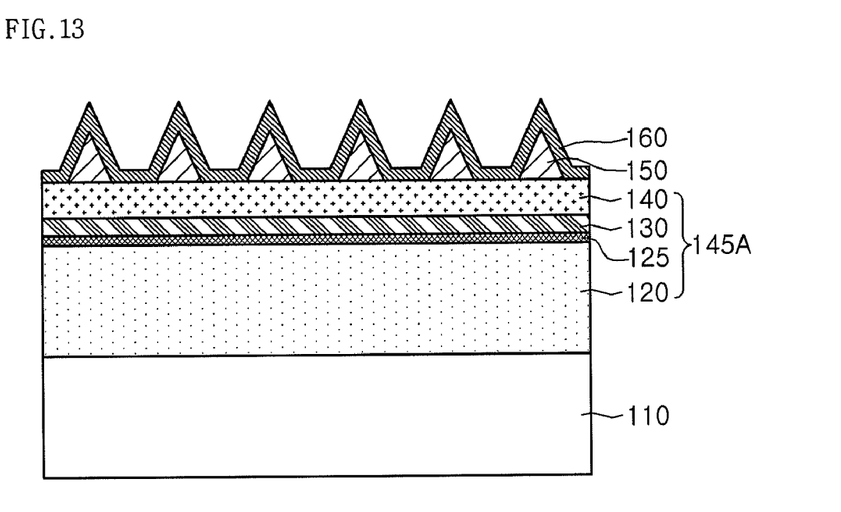
FIGS. 13 and 14 are exemplary diagrams illustrating a process for manufacturing a semiconductor light emitting device according to a second embodiment.
Figure 14:
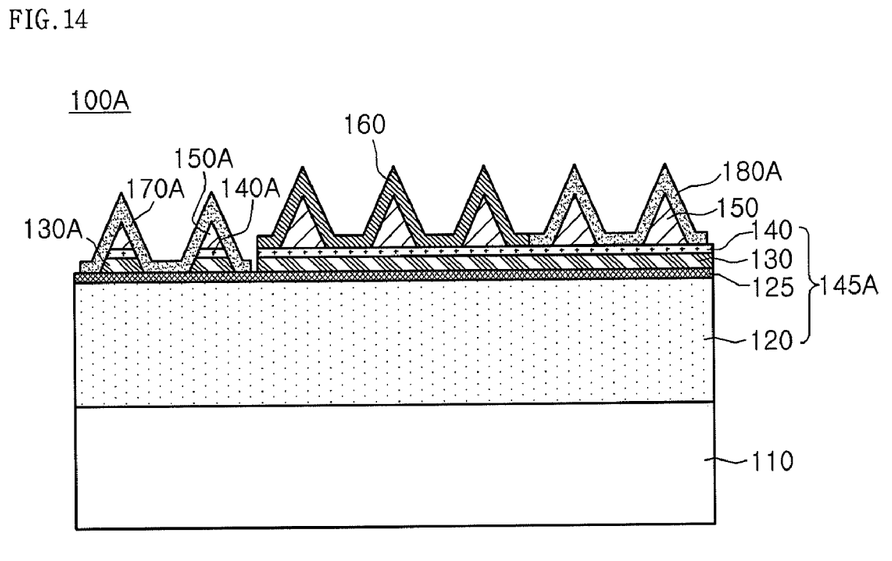

FIGS. 13 and 14 are exemplary diagrams illustrating a process for manufacturing a semiconductor light emitting device according to a second embodiment. In description of the second embodiment, repetitive description on the same elements as those of the first embodiment will be omitted and refers to that of the first embodiment.

Referring to FIG. 13, a light emitting structure 145A comprises the first conductive semiconductor layer 120, a 2Ath conductive semiconductor layer 125, the active layer 130 and the second conductive semiconductor layer 140 which are sequentially stacked.

The 2Ath conductive semiconductor layer 125 may be formed of any one of semiconductors such as the compound semiconductors of group III-V elements (on which a second conductive dopant is doped), for example, GaN, AlN, AlGaN, InGaN, InN, InAlGaN and AlInN. In a case where the 2Ath conductive semiconductor layer 125 is a P-type semiconductor layer, the second conductive dopant comprises a P-type dopant such as Mg and Ze.

Herein, the 2Ath conductive semiconductor layer is formed in consideration of the electric characteristics of a forward operation.

The first conductive semiconductor layer 120 may be formed of an N-type semiconductor layer, the second conductive semiconductor layer 140 may be formed of a P-type semiconductor layer, and the third semiconductor structure 150 may be formed of an N-type semiconductor layer (or a P-type semiconductor layer). The conductive characteristics of the semiconductor layer may be formed in an inverse structure.

Referring to FIGS. 13 and 14, mesa etching is performed in a portion of the region of a semiconductor light emitting device 10A. Upon mesa etching, the transparent electrode layer 160 existing in the mesa etching region is etched so that it is removed.

A sub third semiconductor structure 150A, a sub second conductive semiconductor layer 140A and a sub active layer 130A are formed in the mesa etching region. The layers 150A, 140A and 130A of the mesa etching region are etched in a state where they have a certain etching difference, and thus are formed in a horn shape.

The etching depth of the mesa etching region may be performed until a portion of the 2Ath conductive semiconductor layer 125 or a portion of the first conductive semiconductor layer 120 is exposed. In this case, the layers 150A and 140A of the mesa etching region are separated from the second conductive semiconductor layer 150 and the active layer 140 in electricity or structure.

A first electrode 170A is formed in the surfaces of the layers 150A, 140A and 130A of the mesa etching region.

A sub light emitting structure may be formed in the mesa etching region. The sub light emitting structure is disposed in a form where an N-type semiconductor layer and a P-type semiconductor layer exist in the both sides of the sub active layer 130A, for example, an N-P-active layer-P-N structure. The resistance of the sub light emitting structure is designed at a low level, and thus light can be generated through the sub active layer 130A of the mesa etching region, thereby increasing an amount of light emission.

A second electrode 180A is formed on the second conductive semiconductor layer 150 and the active layer 140.

Figure 15:
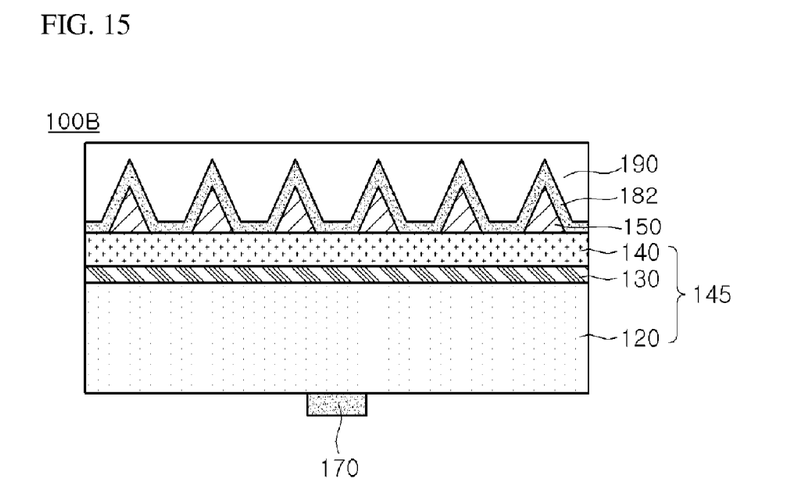
FIG. 15 is a side-sectional view of a semiconductor light emitting device according to a third embodiment.

FIG. 15 is a side-sectional view of a semiconductor light emitting device according to a third embodiment. In description of the third embodiment, repetitive description on the same elements as those of the first embodiment will be omitted and refers to that of the first embodiment.

Referring to FIG. 15, a semiconductor light emitting device 100B comprises the first conductive semiconductor layer 120, the active layer 130, the second conductive semiconductor layer 140 and the third semiconductor structure 150 which are sequentially stacked on a substrate (not shown).

A second electrode 182 is formed on the second conductive semiconductor layer 150 and the active layer 140, and a conductive support number 190 is formed on the second electrode 182.

The second electrode 182 may be formed of a reflection electrode material such as Al, Ag, Pd, Rh, Pt and Ir, and the conductive support number 190 may be formed of a material such as copper, gold and carrier wafer (for example, Si, Ge, GaAs, ZnO, SiC and the like).

Subsequently, the substrate (reference numeral 110 of FIG. 10) is removed by a physical or/and chemical process, and the first electrode 170 is formed under the first conductive semiconductor layer 120. The substrate (reference numeral 110 of FIG. 10) may be removed by a Laser Lift Off (LLO) process being the physical removing process, and the chemical removing process may remove the substrate with a wet-etching solution. However, the removing process of the substrate is not limited to this embodiment.

The technical characteristics of the above-disclosed first to third embodiments are not limited to the each embodiment, and can be applied to another embodiment.

Although the embodiment has been made in relation to the compound semiconductor light emitting device comprising the N-P junction structure as an example, the compound semiconductor light emitting device comprising an N-P-N structure, a P-N structure or a P-N-P structure can be implemented. In the description of the embodiment, it will be understood that, when a layer (or film), a region, a pattern, or a structure is referred to as being "on(above/over/upper)" or "under(below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
   a first conductive semiconductor layer;
   an active layer on the first conductive semiconductor layer;
   a second conductive semiconductor layer on the active layer;
   a plurality of third semiconductor structures on the second conductive semiconductor layer, wherein the plurality of third semiconductor structures are spaced apart from each other; and
   an electrode layer on at least one of the plurality of third semiconductor structures.

2. The semiconductor light emitting device according to claim 1, wherein the plurality of third semiconductor structures has a multi-angle horn shape and/or a multi-angle truncated-horn shape.

3. The semiconductor light emitting device according to claim 1, wherein the plurality of third semiconductor structures comprises at least one of GaN, InN, AlN, InGaN, AlGaN and AlInGaN.

4. The semiconductor light emitting device according to claim 1, wherein the plurality of third semiconductor structures is formed of a conductive semiconductor comprising an N-type dopant or a P-type dopant.

5. The semiconductor light emitting device according to claim 1, wherein the electrode layer includes at least one of a transparent electrode layer and a reflection electrode layer.

6. The semiconductor light emitting device according to claim 1, wherein the plurality of third semiconductor structures has a horn-shape, and an internal angle of a horn-shaped point of the plurality of third semiconductor structures is formed as an acute angle.

7. The semiconductor light emitting device according to claim 1, wherein a tilt angle between a bottom and slope of the plurality of third semiconductor structures is formed at about 10° to 80°.

8. The semiconductor light emitting device according to claim 1, comprising:
a second electrode on the second conductive semiconductor layer and/or the plurality of third semiconductor structures,
wherein the electrode layer is disposed on the second conductive semiconductor layer and is electrically connected to the second electrode.

9. A semiconductor light emitting device, comprising:
a first conductive semiconductor layer;
an active layer on a first area of the first conductive semiconductor layer;
a second conductive semiconductor layer on the active layer;
a plurality of third semiconductor structures on the second conductive semiconductor layer, wherein the plurality of third semiconductor structures are spaced apart from each other;
a sub light emitting structure on a second area of the first conductive semiconductor layer; and
a first electrode on the sub light emitting structure.

10. The semiconductor light emitting device according to claim 9, wherein the sub light emitting structure comprises:
a fourth conductive semiconductor layer between the first conductive semiconductor layer and the active layer;
a sub active layer separated from the active layer, the sub active layer on a second area of the fourth conductive semiconductor layer; and
a sub second conductive semiconductor layer separated from the second conductive semiconductor layer, the sub second conductive semiconductor layer on the sub active layer.

11. A semiconductor light emitting device, comprising:
a first conductive semiconductor layer;
an active layer on the first conductive semiconductor layer;
a second conductive semiconductor layer on the active layer;
a plurality of third semiconductor structures on the second conductive semiconductor layer, wherein the plurality of third semiconductor structures are spaced apart from each other;
an electrode layer disposed on the second conductive semiconductor layer, wherein the electrode layer is disposed between the plurality of third semiconductor structures; and
an electrode on the electrode layer.

12. The semiconductor light emitting device according to claim 11, wherein the first conductive semiconductor layer comprises an N-type semiconductor layer, the second conductive semiconductor layer comprises a P-type semiconductor layer, and the plurality of third semiconductor structures comprises an N-type semiconductor layer or a P-type semiconductor layer.

13. The semiconductor light emitting device according to claim 11, wherein a diameter of a bottom of the plurality of third semiconductor structures or a height of the plurality of third semiconductor structures is about 1 µm to 10 µm.

14. The semiconductor light emitting device according to claim 11, wherein the plurality of third semiconductor structures is formed of the same semiconductor material as that of the second conductive semiconductor layer.

15. The semiconductor light emitting device according to claim 11,
wherein the electrode layer is disposed on the plurality of third semiconductor structures, and
wherein the electrode layer includes at least one of a transparent electrode layer and a reflection electrode layer.

16. The semiconductor light emitting device according to claim 11, further comprising:
at least one of an undoped semiconductor layer, a buffer layer, a substrate having a concave-convex pattern, and another electrode under the first conductive semiconductor layer.

17. A semiconductor light emitting device, comprising:
a first conductive semiconductor layer;
an active layer on the first conductive semiconductor layer;
a second conductive semiconductor layer on the active layer;
a plurality of horn-shaped third semiconductor structures spaced apart on the second conductive semiconductor layer; and
a horn-shaped electrode layer on the third semiconductor structure.

18. The semiconductor light emitting device according to claim 17, wherein the horn shape is formed in a point of an acute angle.

19. The semiconductor light emitting device according to claim 17, wherein the electrode layer comprises at least one of a transparent electrode layer, a reflection electrode layer and a second electrode layer.

20. The semiconductor light emitting device according to claim 17, wherein the plurality of third semiconductor structures comprises a group III-V compound semiconductor on which an N-type or P-type dopant is doped.

* * * * *